(12) United States Patent
Lindley et al.

(10) Patent No.: US 10,658,206 B2
(45) Date of Patent: May 19, 2020

(54) METHOD OF FORMING A COMPOSITE SUBSTRATE FOR LAYERED HEATERS

(71) Applicant: Watlow Electric Manufacturing Company, St. Louis, MO (US)

(72) Inventors: Jacob R. Lindley, St. Louis, MO (US); Dean J. Meyer, Columbia, MO (US); Alexander D. Glew, Mountain View, CA (US)

(73) Assignee: Watlow Electric Manufacturing Company, St. Louis, MO (US)

( * ) Notice: Subject to any disclaimer, the term of this patent is extended or adjusted under 35 U.S.C. 154(b) by 67 days.

(21) Appl. No.: 14/875,757

(22) Filed: Oct. 6, 2015

(65) Prior Publication Data
US 2016/0035602 A1    Feb. 4, 2016

Related U.S. Application Data

(63) Continuation of application No. 13/541,006, filed on Jul. 3, 2012, now Pat. No. 9,224,626.

(51) Int. Cl.
| | |
|---|---|
| *H01L 21/67* | (2006.01) |
| *H05B 3/00* | (2006.01) |
| *H05B 3/06* | (2006.01) |
| *H05B 3/12* | (2006.01) |
| *H05B 3/14* | (2006.01) |
| *H05B 3/28* | (2006.01) |
| *H01C 17/06* | (2006.01) |
| *H01L 21/683* | (2006.01) |
| *H02N 13/00* | (2006.01) |

(52) U.S. Cl.
CPC ....... *H01L 21/67103* (2013.01); *H01C 17/06* (2013.01); *H01L 21/6831* (2013.01); *H02N 13/00* (2013.01); *H05B 3/0014* (2013.01); *H05B 3/06* (2013.01); *H05B 3/12* (2013.01); *H05B 3/14* (2013.01); *H05B 3/28* (2013.01); *H05B 2203/017* (2013.01); *Y10T 29/49083* (2015.01)

(58) Field of Classification Search
CPC . H01L 21/67103; H01L 21/6831; H05B 3/14; H05B 3/28; H05B 3/0014; H05B 3/12; Y10T 29/49083
USPC ...................... 29/611, 610.1, 592.1
See application file for complete search history.

(56) References Cited

U.S. PATENT DOCUMENTS

| | | |
|---|---|---|
| 5,730,803 A | 3/1998 | Steger et al. |
| 6,094,334 A | 7/2000 | Bedi et al. |

(Continued)

FOREIGN PATENT DOCUMENTS

| | | |
|---|---|---|
| CN | 101682936 | 3/2010 |
| CN | 102160167 | 8/2011 |

(Continued)

*Primary Examiner* — Peter Dungba Vo
*Assistant Examiner* — Azm A Parvez
(74) *Attorney, Agent, or Firm* — Burris Law, PLLC

(57) ABSTRACT

A method of forming a heater assembly for use in semiconductor processing includes thermally securing a heater substrate to an application substrate; and applying a layered heater having at least one functional layer to the heater substrate after the heater substrate is secured to the application substrate. The heater substrate defines a material having a coefficient of thermal expansion that is matched to a coefficient of thermal expansion of the functional layer. The material of the functional layer is not capable of withstanding the elevated temperature of the thermal securing step.

19 Claims, 5 Drawing Sheets

(56) References Cited

U.S. PATENT DOCUMENTS

| | | | |
|---|---|---|---|
| 6,448,538 B1 * | 9/2002 | Miyata | H05B 3/143 |
| | | | 219/444.1 |
| 7,044,399 B2 | 5/2006 | Yoshinobu | |
| 7,196,295 B2 * | 3/2007 | Fennewald | H05B 3/42 |
| | | | 219/543 |
| 7,800,021 B2 * | 9/2010 | Pilavdzic | C23C 28/321 |
| | | | 219/212 |
| 8,624,102 B2 | 1/2014 | Chan et al. | |
| 8,680,443 B2 * | 3/2014 | McMillin | H05B 3/28 |
| | | | 219/543 |
| 2004/0222210 A1 * | 11/2004 | Lin | H01L 21/67103 |
| | | | 219/444.1 |
| 2007/0138601 A1 | 6/2007 | Fan et al. | |
| 2011/0229837 A1 | 9/2011 | Migita | |

FOREIGN PATENT DOCUMENTS

| | | |
|---|---|---|
| JP | H06216224 | 8/1994 |
| JP | H09326431 | 12/1997 |
| JP | 2001102436 | 4/2001 |
| JP | 200233286 | 1/2002 |
| JP | 2004349666 | 12/2004 |
| JP | 2008148219 | 6/2008 |
| JP | 201052015 | 3/2010 |
| JP | 2010052015 A * | 3/2010 |
| JP | 2010518255 | 5/2010 |
| JP | 2011061049 | 3/2011 |
| WO | 2010/061740 | 6/2010 |

* cited by examiner

US 10,658,206 B2

METHOD OF FORMING A COMPOSITE SUBSTRATE FOR LAYERED HEATERS

CROSS-REFERENCE TO RELATED APPLICATIONS

This application is a continuation application of U.S. patent application Ser. No. 13/541,006 filed on Jul. 3, 2012, the entire disclosure of which is incorporated herein by reference.

FIELD

The present disclosure relates to layered heaters, and more specifically to methods of forming layered heaters bonded to a semiconductor processing apparatus with improved reliability at elevated temperatures.

BACKGROUND

The statements in this section merely provide background information related to the present disclosure and may not constitute prior art.

A layered heater typically includes a plurality of functional layers applied on a substrate by layered processes. The plurality of functional layers may include a dielectric layer on the substrate, a resistive heating layer on the dielectric layer, and a protective layer on the resistive heating layer. The materials for the different functional layers and the substrate are carefully chosen to have compatible coefficient of thermal expansion (CTE) to reduce shear stress generated at the joining interfaces at elevated temperatures. The shear stress may cause generation of cracks or delamination at the joining interfaces, resulting in heater failure.

Only a limited number of materials can be used to form the different functional layers by a specific layered process, thereby limiting the selection of materials for the substrate, which should have a CTE matching the CTE of the dielectric layer applied on the substrate or matching the CTE of the heating layer. For example, when alumina ceramic is used to form the dielectric layer, alumina nitride or molybdenum is generally used to form the substrate due to its chemical and CTE compatibility with the alumina ceramic.

The layered heater may need to be joined to a heating target in some applications. For example, the layered heater may be joined to an electrostatic chuck to form a heated electrostatic chuck. However, the limited selection of materials for the substrate makes joining the layered heater to the electrostatic chuck difficult. When the substrate of the layered heater has a CTE that does not match the CTE of the chuck body, the heated electrostatic chuck is likely to fail due to generation of cracks or delamination at the joining interface at elevated temperatures.

SUMMARY

In one form, a method of forming a heater assembly for use in semiconductor processing includes thermally securing a heater substrate to an application substrate; and applying a layered heater having at least one functional layer to the heater substrate after the heater substrate is secured to the application substrate. The heater substrate defines a material having a coefficient of thermal expansion that is matched to a coefficient of thermal expansion of the functional layer. The material of the functional layer is not capable of withstanding the elevated temperature of the thermal securing step.

According to another aspect of the disclosure, the functional layer is a bond layer and the application of the layered heater includes applying a first dielectric layer onto the heater substrate, applying a resistive heating layer onto the first dielectric layer, and applying a second dielectric layer onto the resistive heating layer.

In another form, a method of forming a heated electrostatic chuck includes providing an electrostatic chuck having a chuck top, securing an application substrate to the chuck top, and forming a heater assembly according to the method described above and further defined herein.

Further areas of applicability will become apparent from the description provided herein. It should be understood that the description and specific examples are intended for purposes of illustration only and are not intended to limit the scope of the present disclosure.

DRAWINGS

The drawings described herein are for illustration purposes only and are not intended to limit the scope of the present disclosure in any way.

In order that the invention may be well understood, there will now be described an embodiment thereof, given by way of example, reference being made to the accompanying drawing, in which.

Corresponding reference numerals indicate corresponding parts throughout the several views of the drawings.

DETAILED DESCRIPTION

The following description is merely exemplary in nature and is not intended to limit the present disclosure, application, or uses.

Figure 1:
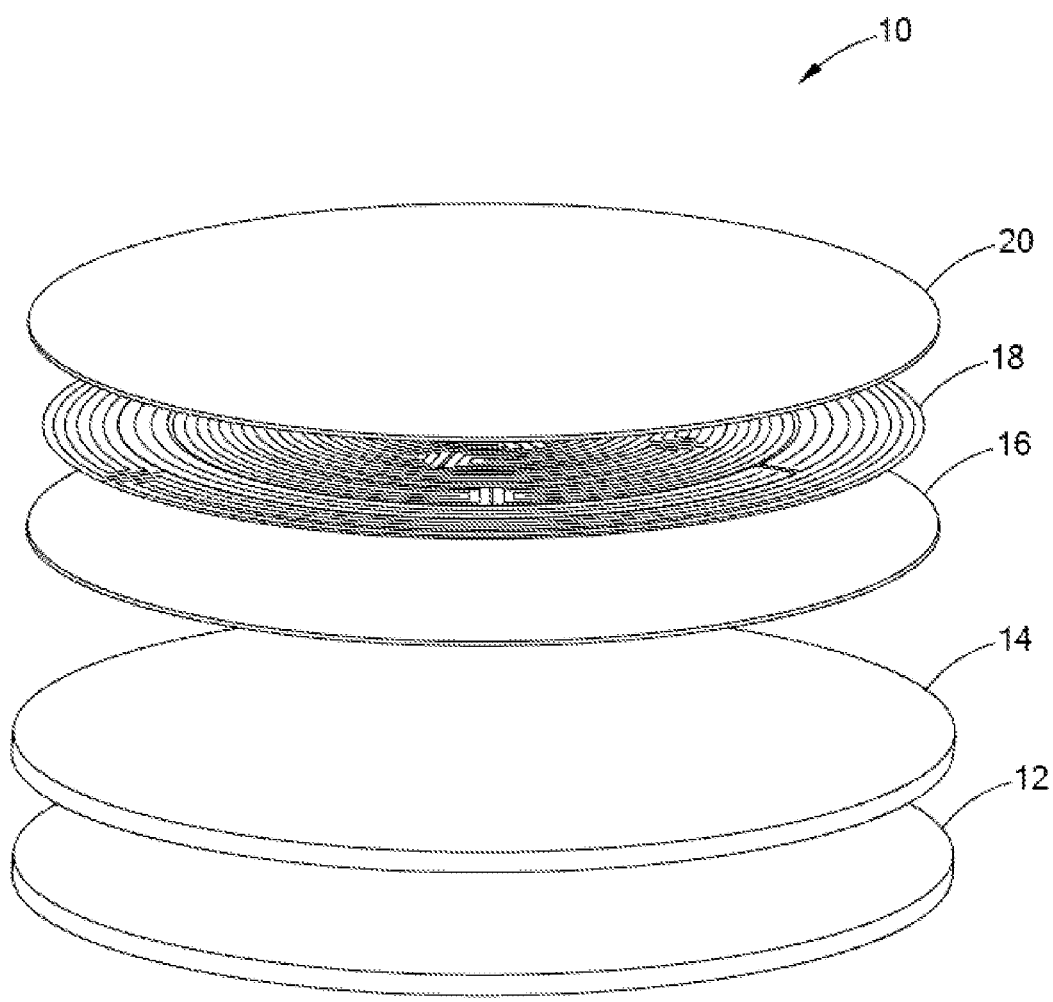
FIG. 1 is an exploded view of a layered heater constructed in accordance with the teachings of the present disclosure.

Referring to FIG. 1, a layered heater 10 constructed in accordance with the teachings of the present disclosure includes an application substrate 12, a heater substrate 14, a first dielectric layer 16 formed on the heater substrate 14, a resistive heating layer 18 formed on the first dielectric layer 16, and a second dielectric layer 20 formed on the resistive heating layer 18. The first dielectric layer 16, the resistive heating layer 18 and the second dielectric layer 20 are formed by a layered process, such as thick film, thin film, thermal spray and sol gel.

Figure 2:
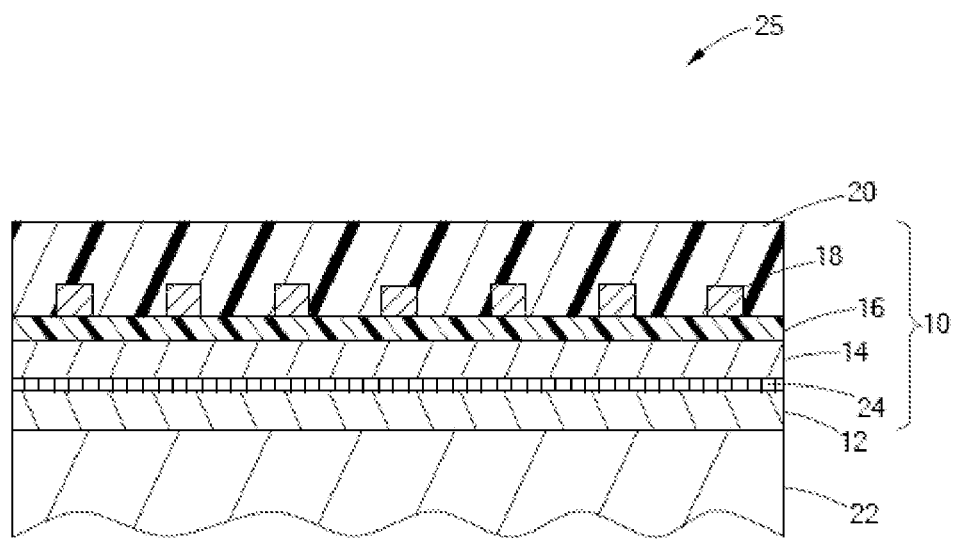
FIG. 2 is a cross-sectional view of a heater assembly including a layered heater and a heating target and constructed in accordance with the teachings of the present disclosure.

Referring to FIG. 2, the layered heater 10 is joined to a heating target 22 to form a heater assembly 25. For example, the heating target 22 may be a chuck top of a heated electrostatic chuck for semiconductor processing. The application substrate 12 and the heater substrate 14 are made of different materials and are joined by brazing to form a composite chuck.

A brazing layer 24 is formed between the application substrate 12 and the heater substrate 14. The brazing material may be a sliver brazing material. Other joining processes, such as welding, soldering, diffusion bonding, epoxying, vulcanizing, may be used to join the application substrate 12 and the heater substrate 14 without departing from the scope of the present disclosure. Similarly, the application substrate 12 may be joined to the heating target 22 by any conventional joining method, such as brazing, welding, soldering, diffusion boding, epoxying, vulcanizing.

The application substrate 12 includes a material having a coefficient of thermal expansion (CTE) that matches the CTE of the heating target 22. Alternatively, the application substrate 12 may be an integral part of the heating target to which the heat from the layered heater is transferred. The heater substrate 14 includes a material having a CTE that matches the CTE of the first dielectric layer 16. In other words, the material of the application substrate 12 depends on the materials of the heating target 22, whereas the material of the heater substrate 14 depends on the materials of the first dielectric layer 16.

For example, when the first dielectric layer 16 includes alumina ceramic, the heater substrate 14 may be made of alumina nitride or molybdenum. The application substrate 12 may include a material having a CTE that can easily match the CTE of most suitable materials for the heating target 22, regardless of the materials of the first dielectric layer 16 and the heater substrate 14. The application substrate 12 may include austenitic stainless steel, which has a CTE matching a wider selection of materials. Therefore, the layered heater 10 can be relatively easily joined to the heating target 22.

The layered heater 10 may be a layered heater formed by thick film, thin film, thermal-spray, and sol-gel process. The resistive heating layer 18 may be formed by applying a resistive layer throughout the first dielectric layer 14, followed by a laser removal process to form a circuit pattern.

In still another form, the resistive heating layer 18 is formed of a material having sufficient temperature coefficient of resistance such that the heating layer 18 functions as both a heater and a temperature sensor, commonly referred to as "two-wire control." Such heaters and their materials are disclosed, for example, in U.S. Pat. No. 7,196,295 and pending U.S. patent application Ser. No. 11/475,534, which are commonly assigned with the present application and the disclosures of which are incorporated herein by reference in their entirety.

Figure 3:
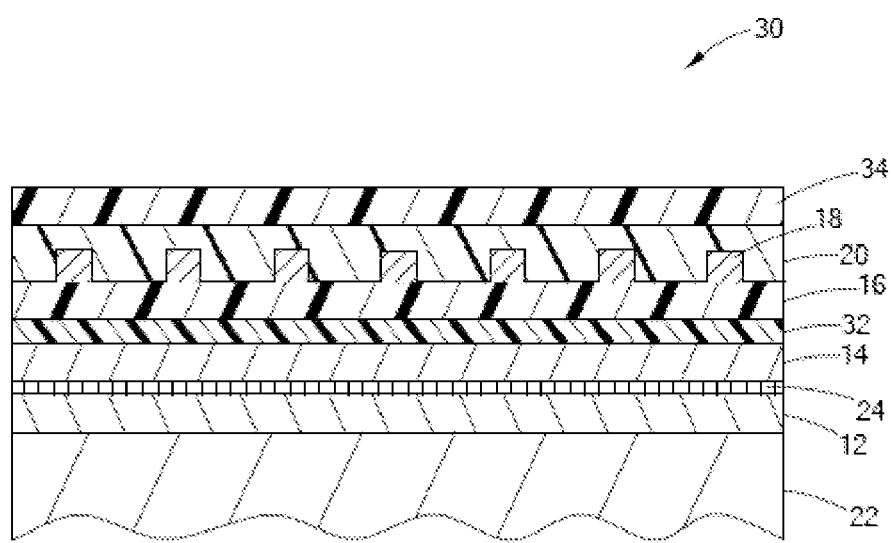
FIG. 3 is a cross-sectional view of a variant of a heater assembly including a layered heater and a heating target and constructed in accordance with the teachings of the present disclosure.

Referring to FIG. 3, a heater assembly 30 has a structure similar to that of the heater assembly 10 of FIG. 2 except that the layered heater further includes a bond coat layer 32 and a topcoat 34. The bond coat layer 32 is applied on the heater substrate 14. The topcoat 34 is applied on the second dielectric layer 20.

While two substrates are described in the present disclosure to form a composite substrate, more than two substrates may be used to form a composite substrate, which provides a gradual transition over multiple substrates in terms of coefficient of thermal expansion.

Figure 4:
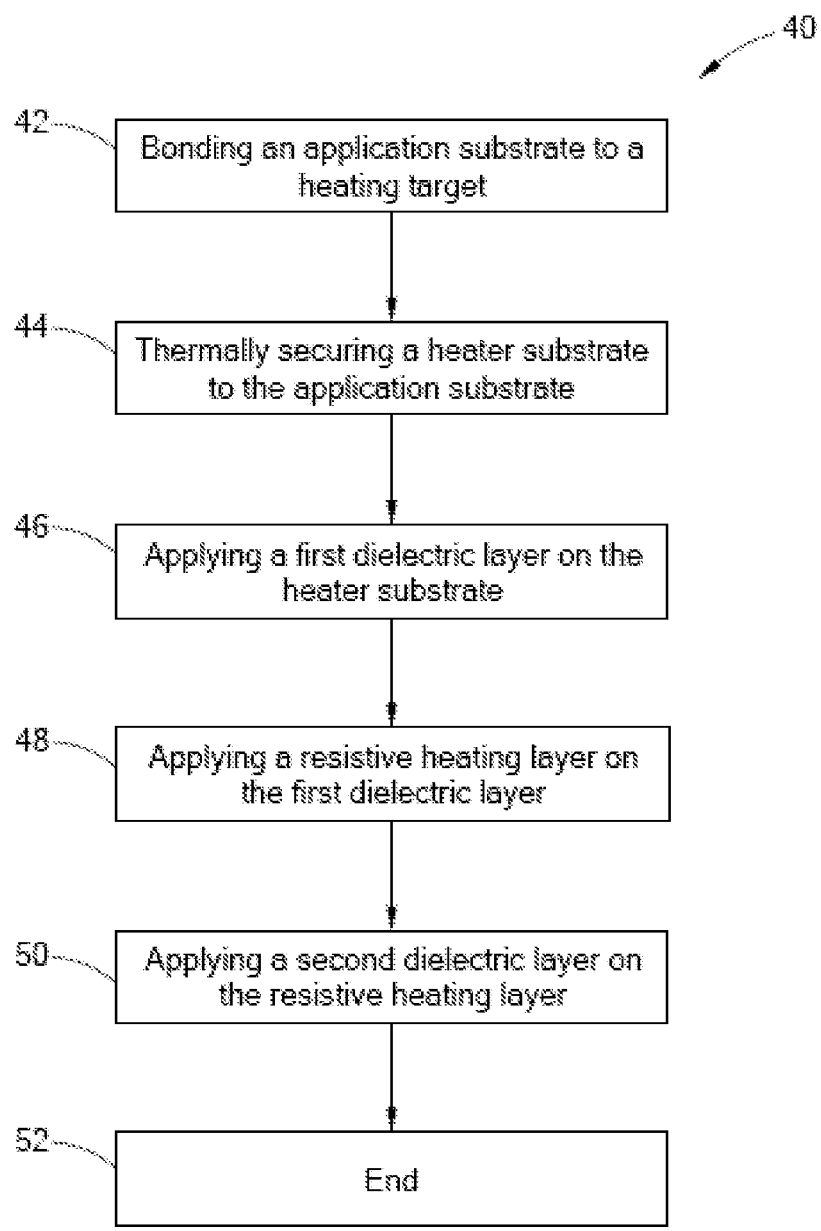
FIG. 4 is a flow diagram of a method of forming a heater assembly for use in semiconductor processing.

Referring to FIG. 4, a method 40 of forming a heater assembly 25 for use in semiconductor processing includes bonding an application substrate 12 to a heating target 22 in step 42. When the application substrate 12 is an integral part of the heating target 22, this step is eliminated. The heater substrate 14 is then thermally secured to the application substrate 12 in step 44. Thermally securing may include brazing, welding, soldering, diffusion bonding, epoxying, vulcanizing at a first temperature. A layered heater is then applied to the heater substrate 14 after the application substrate 12 is joined to the heating target 22.

The application of the layered heater on the heater substrate 14 includes applying a first dielectric layer 16 on the heater substrate 14 in step 46. A resistive heating layer 18 is then applied on the first dielectric layer 16 in step 48. The resistive heating layer 18 may be applied to form a circuit pattern when applied on the first dielectric layer 16. Alternatively, the resistive heating layer 18 may be applied by forming a continuous layer on the entire surface of the first dielectric layer 16, followed by a laser removal process to form the desired circuit pattern. Finally, a second dielectric layer 20 is applied on the resistive heating layer 18 in step 50. The method 40 ends in step 52.

Figure 5:
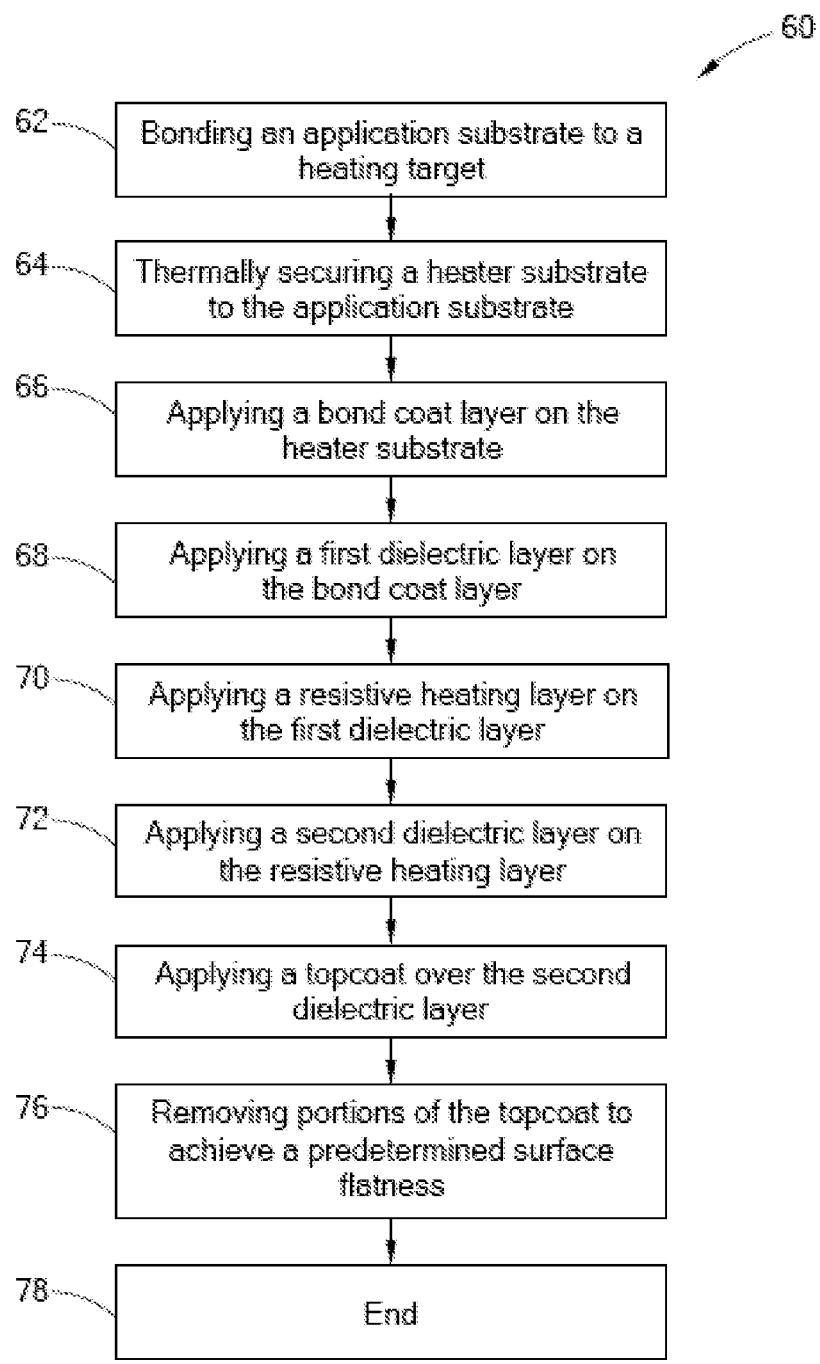
FIG. 5 is a flow diagram of a method of forming another heater assembly for use in semiconductor processing.

Referring to FIG. 5, a method 60 of forming a heater assembly 30 for use in semiconductor processing is similar to the method 40 of FIG. 4 except for the steps of applying a bond coat layer and a topcoat. More specifically, the method 60 includes bonding the application substrate 12 to the heating target 22 in step 62. The heater substrate 14 is then thermally secured to the application substrate 12 in step 64. Thermally securing may include brazing, welding, soldering, diffusion bonding, epoxying, vulcanizing at a first temperature. Thereafter, a layered heater is applied to the heater substrate 14 after the heater substrate 14 is joined to the application substrate 12.

The application of the layered heater to the heater substrate 14 includes applying a bond coat layer 32 on the heater substrate 14 in step 66. A first dielectric layer 16 is then applied on the bond coat layer 32 in step 68. A resistive heating layer 18 is applied on the first dielectric layer 16 in step 70. A second dielectric layer 20 is applied on the resistive heating layer 18 in step 72. A topcoat 34 is applied over the second dielectric layer 20 in step 74. Finally, portions of the topcoat 34 are removed to achieve a predetermined surface flatness in step 76. The method 60 ends in step 78.

In the methods 40 and 60 of the present disclosure, brazing is used to effectively and reliably join the heater substrate 14 to the application substrate 12. The application substrate 12 is made of a material having a CTE that matches the CTE of the material of the heating target 22. The heater substrate 14 is made of a material having a CTE that matches the CTE of the material of the first dielectric layer 16. The composite substrate enables the layered heater to be applied to a heating target 22 having a CTE that does not match (i.e., is significantly different from) the CTE of the heater substrate 14.

Moreover, the brazing process, which requires a relatively high temperature, is performed before the various functional layers of the layered heater are applied to the heater substrate 14. Therefore, the layered heater is not subjected to the undesirable high temperature during the brazing process and thus can maintain its integrity.

The present method enables better matching of the CTE of the layered heater to any heating target 22 by using an application substrate. The present method also ensures the integrity of the layered heater by brazing the heater substrate to the application substrate before the different functional layers of the layered heater are formed on the heater substrate. Therefore, the present method can improve physical/material characteristics of the heater assembly such as machinability, surface roughness, surface hardness, chemical compatibility, thermal conductivity, electrical conductivity, emissivity, appearance, cost, etc.

The description of the disclosure is merely exemplary in nature and, thus, variations that do not depart from the substance of the disclosure are intended to be within the scope of the disclosure. Such variations are not to be regarded as a departure from the spirit and scope of the disclosure.

What is claimed is:

1. A method of forming a heater assembly for use in semiconductor processing comprising the following steps in sequence:
    individually forming a heater substrate and an application substrate such that the heater substrate is separated from the application substrate when the heater substrate is formed;
    securing the heater substrate to the application substrate at an elevated temperature using a thermal bonding process to form a bonding layer after the heater substrate and the application substrate are formed;
    applying a first dielectric layer onto the heater substrate by a layered process after the heater substrate is secured to the application substrate; and
    applying a resistive heating layer onto the first dielectric layer by the layered process after the first dielectric layer is applied onto the heater substrate,
    wherein the layered process is selected from a group consisting of thick film, thin film, thermal spray, and sol-gel processes and at a temperature lower than the elevated temperature at which the heater substrate is secured to the application substrate using the thermal bonding process, and
    wherein the heater substrate defines a material having a coefficient of thermal expansion that is matched to a coefficient of thermal expansion of a material of the first dielectric layer, the material of the first dielectric layer not being capable of withstanding the elevated temperature of the thermal bonding process.

2. The method according to claim 1, further comprising:
    applying a bond coat layer onto the heater substrate by the layered process after the heater substrate is secured to the application substrate;
    applying the first dielectric layer onto the bond coat layer; and
    applying a second dielectric layer onto the resistive heating layer.

3. The method according to claim 1, wherein the thermal bonding process is selected from the group consisting of brazing, welding, soldering, diffusion bonding, epoxying, and vulcanizing.

4. The method according to claim 1, wherein the application substrate and the heater substrate form a composite substrate with at least two substrates.

5. The method according to claim 1, wherein the application substrate forms an integral part of a heating target to which heat from the heater assembly is transferred.

6. The method according to claim 2, wherein each of the layers are applied by a thermal spray process.

7. The method according to claim 2, wherein a circuit pattern is formed in the resistive heating layer by a laser removal process.

8. The method according to claim 2, wherein the first dielectric layer is an alumina material, the heater substrate is a molybdenum material, and the application substrate is an austenitic stainless steel material.

9. The method according to claim 2 further comprising applying a topcoat layer over the second dielectric layer and subsequently removing portions of the topcoat with a process to achieve a predetermined surface flatness.

10. The method according to claim 2, wherein each of the steps is performed in sequence.

11. The method according to claim 2, wherein the resistive heating layer is formed of a material having sufficient temperature coefficient of resistance such that the heating layer functions as both a heater and a temperature sensor.

12. The method according to claim 3, wherein the heater substrate is brazed to the application substrate.

13. The method according to claim 4, wherein the composite substrate further comprises more than two substrates such that there is a gradual transition over the composite substrate in terms of coefficient of thermal expansion.

14. The method according to claim 9, wherein a thickness of the topcoat is non-uniform, such that a predetermined level of surface flatness is achieved.

15. The method according to claim 12, wherein a silver brazing material is used.

16. A method of forming a heated electrostatic chuck, the method comprising:
    providing an electrostatic chuck having a chuck top;
    securing an application substrate to the chuck top; and
    forming a heater assembly, comprising:
        forming a heater substrate, wherein the heater substrate and the application substrate are individually formed such that the heater substrate is separated from the application substrate when the heater substrate is formed;
        securing the heater substrate to the application substrate at an elevated temperature using a thermal bonding process to form a bonding layer after the heater substrate and the application substrate are formed;
        applying a first dielectric layer onto the heater substrate by a layered process after the heater substrate is secured to the application substrate; and
        applying a resistive heating layer onto the first dielectric layer by the layered process after the first dielectric layer is applied onto the heater substrate,
        wherein the layered process is selected from a group consisting of thick film, thin film, thermal spray, and sol-gel processes and at a temperature lower than the elevated temperature at which the heater substrate is secured to the application substrate using the thermal bonding process, and
        wherein the heater substrate defines a material having a coefficient of thermal expansion that is matched to a coefficient of thermal expansion of a material of the first dielectric layer, the material of the first dielectric not being capable of withstanding the elevated temperature of the thermal bonding process.

17. The method according to claim 16, further comprising:
    applying a bond coat layer onto the heater substrate by the layered process after the heater substrate is secured to the application substrate;
    applying the first dielectric layer onto the bond coat layer; and
    applying a second dielectric layer onto the resistive heating layer.

18. The method according to claim 16, wherein the thermal bonding process is selected from the group consisting of brazing, welding, soldering, diffusion bonding, epoxying, and vulcanizing.

19. The method according to claim 16, wherein each of the layers are applied by a thermal spray process.

* * * * *